(12) United States Patent
Taguchi (10) Patent No.: US 10,560,069 B2
(45) Date of Patent: Feb. 11, 2020

(54) ELASTIC WAVE APPARATUS

(71) Applicant: Murata Manufacturing Co., Ltd., Nagaokakyo-shi, Kyoto-fu (JP)

(72) Inventor: Tomoko Taguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 105 days.

(21) Appl. No.: 16/001,000

(22) Filed: Jun. 6, 2018

(65) Prior Publication Data

US 2018/0375495 A1 Dec. 27, 2018

(30) Foreign Application Priority Data

Jun. 26, 2017 (JP) ................................. 2017-124027
Mar. 19, 2018 (JP) ................................. 2018-051016

(51) Int. Cl.
*H03H 9/72* (2006.01)
*H03H 9/70* (2006.01)
*H03H 9/00* (2006.01)
*H03H 9/05* (2006.01)

(52) U.S. Cl.
CPC ........ *H03H 9/0566* (2013.01); *H03H 9/0004* (2013.01); *H03H 9/059* (2013.01); *H03H 9/0557* (2013.01); *H03H 9/0561* (2013.01); *H03H 9/0576* (2013.01); *H03H 9/706* (2013.01); *H03H 9/72* (2013.01); *H03H 9/725* (2013.01)

(58) Field of Classification Search
CPC .. H03H 9/0004; H03H 9/0557; H03H 9/0561; H03H 9/0566; H03H 9/0571; H03H 9/0576; H03H 9/059; H03H 9/9706; H03H 9/72; H03H 9/725

USPC .......................................... 333/133, 193, 195
See application file for complete search history.

(56) References Cited

U.S. PATENT DOCUMENTS

| 7,339,445 | B2 * | 3/2008 | Aigner ................... | H03H 9/706 |
| | | | | 333/133 |
| 9,455,682 | B2 * | 9/2016 | Kuzushita ............ | H03H 9/0566 |
| 9,647,634 | B2 * | 5/2017 | Michigami .......... | H03H 9/0576 |
| 10,141,913 | B2 * | 11/2018 | Takamine ................ | H03H 7/38 |
| 10,158,342 | B1 * | 12/2018 | Takamine ................ | H01L 23/66 |
| 2015/0042417 | A1 * | 2/2015 | Onodera .............. | H03H 9/6433 |
| | | | | 333/195 |

(Continued)

FOREIGN PATENT DOCUMENTS

JP 2003-347898 A 12/2003

*Primary Examiner* — Barbara Summons
(74) *Attorney, Agent, or Firm* — Keating & Bennett, LLP (57) ABSTRACT

An elastic wave apparatus includes a multilayer substrate, first through fourth band pass filters, an antenna terminal, and first and second inductors. The multilayer substrate includes first through sixth wiring layers. The first through fourth band pass filters are disposed on the multilayer substrate and are connected to a common node. The antenna terminal is connected to an antenna and also to the common node. The first inductor is connected to the antenna terminal. The second inductor is connected between the first band pass filter and the common node. The first inductor is disposed on the fourth and fifth wiring layers. The second inductor is disposed on the second and third wiring layers which are different from the fourth and fifth wiring layers. The first and second inductors overlap each other at least partially as viewed from above.

18 Claims, 7 Drawing Sheets

(56) References Cited

U.S. PATENT DOCUMENTS

| | | | |
|---|---|---|---|
| 2016/0156329 A1* | 6/2016 | Takeuchi | H03H 9/0542 |
| | | | 333/124 |
| 2016/0156335 A1* | 6/2016 | Takeuchi | H03H 9/6433 |
| | | | 333/129 |
| 2016/0322956 A1* | 11/2016 | Takeuchi | H03H 9/0542 |
| 2017/0111078 A1* | 4/2017 | Onodera | H03H 9/64 |
| 2018/0337652 A1* | 11/2018 | Mizoguchi | H03H 9/706 |

* cited by examiner

ELASTIC WAVE APPARATUS

CROSS REFERENCE TO RELATED APPLICATIONS

This application claims the benefit of priority to Japanese Patent Application No. 2017-124027 filed on Jun. 26, 2017 and Japanese Patent Application No. 2018-051016 filed on Mar. 19, 2018. The entire contents of these applications are hereby incorporated herein by reference.

BACKGROUND OF THE INVENTION

1. Field of the Invention

The present invention relates to an elastic wave apparatus.

2. Description of the Related Art

An elastic wave apparatus is widely used in a filter of a cellular phone. Japanese Unexamined Patent Application Publication No. 2003-347898 discloses an example of a duplexer used as an elastic wave apparatus. In this duplexer, an inductance element is connected between an antenna terminal and a ground potential to provide impedance matching. Another inductance element is connected between a ground potential and a node between a transmit surface acoustic wave (SAW) filter and a common node between the transmit SAW filter and a receive SAW filter.

In an elastic wave apparatus including plurality of inductance elements, such as that disclosed in Japanese Unexamined Patent Application Publication No. 2003-347898, the total area of the inductance elements in the elastic wave apparatus is increased, thereby making it difficult to reduce the size of the elastic wave apparatus. It is also desirable to further reduce the insertion loss. However, it is difficult to sufficiently reduce the insertion loss in the elastic wave apparatus disclosed in Japanese Unexamined Patent Application Publication No. 2003-347898.

SUMMARY OF THE INVENTION

Preferred embodiments of the present invention provide elastic wave apparatuses each of which is reduced in size and in insertion loss.

An elastic wave apparatus according to a preferred embodiment of the present invention includes a multilayer substrate, a plurality of filter devices, an antenna terminal, and first and second inductors. The multilayer substrate includes a plurality of wiring layers. The plurality of filter devices are disposed on the multilayer substrate and are connected to a common node. The antenna terminal is to be connected to an antenna and also to the common node. The first inductor is connected to the antenna terminal. The second inductor is connected between one of the plurality of filter devices and the common node. The first inductor is disposed on at least one of the plurality of wiring layers. The second inductor is disposed on a wiring layer which is different from the at least one of the plurality of wiring layers on which the first inductor is disposed. The first and second inductors overlap each other at least partially as viewed from above.

In an elastic wave apparatus according to a preferred embodiment of the present invention, the first inductor is connected between the antenna terminal and the common node.

In an elastic wave apparatus according to a preferred embodiment of the present invention, the first inductor is connected between the antenna terminal and a ground potential.

In an elastic wave apparatus according to a preferred embodiment of the present invention, each of the first and second inductors are disposed on multiple wiring layers of the plurality of wiring layers.

In an elastic wave apparatus according to a preferred embodiment of the present invention, the portion of the first inductor disposed on the wiring layer positioned closest to the second inductor has the longest length. The portion of the second inductor disposed on the wiring layer positioned closest to the first inductor has the longest length. This makes it possible to increase the design flexibility in the wiring layers positioned on the outer side of the multilayer substrate.

In an elastic wave apparatus according to a preferred embodiment of the present invention, in adjacent wiring layers among the plurality of wiring layers, at least a portion of the first inductor is disposed on one of the adjacent wiring layers, and at least a portion of the second inductor is disposed on the other one of the adjacent wiring layers. This effectively strengthens electromagnetic coupling between the first and second inductors and accordingly decreases the lengths of wiring portions defining the first and second inductors. The parasitic capacitance is thus effectively reduced, and the quality (Q) factor is effectively increased. As a result, the insertion loss is effectively reduced.

In an elastic wave apparatus according to a preferred embodiment of the present invention, at least a portion of an outer peripheral edge of the first inductor viewed from above is positioned in a region surrounded by an outer peripheral edge of the second inductor viewed from above. This further strengthens electromagnetic coupling between the first and second inductors and further reduces the insertion loss.

In an elastic wave apparatus according to a preferred embodiment of the present invention, at least a portion of an outer peripheral edge of the second inductor viewed from above is positioned in a region surrounded by an outer peripheral edge of the first inductor viewed from above. This further strengthens electromagnetic coupling between the first and second inductors and further reduces the insertion loss.

In an elastic wave apparatus according to a preferred embodiment of the present invention, each of the first and second inductors has a spiral shape as viewed from above.

In an elastic wave apparatus according to a preferred embodiment of the present invention, among the plurality of filter devices, in a filter device connected to the common node via the second inductor, a parallel arm resonator is connected between the second inductor and a ground potential. Among the plurality of filter devices, in each of the filter devices other than the filter device connected to the common node via the second inductor, a filter element located closest to the common node is a series arm resonator. This effectively decreases the inductance value of the second inductor to provide impedance matching and, accordingly, further decreases the length of the second inductor. As a result, the insertion loss is further reduced, and the size of the elastic wave apparatus is also further reduced.

According to preferred embodiments of the present invention, elastic wave apparatuses are reduced in size and in insertion loss.

The above and other elements, features, steps, characteristics and advantages of the present invention will become

DETAILED DESCRIPTION OF THE PREFERRED EMBODIMENTS

Preferred embodiments of the present invention will be described below in detail with reference to the accompanying drawings.

The preferred embodiments are only examples, and the configuration of one preferred embodiment and that of another preferred embodiment may partially be replaced by or combined with each other.

Figure 1:
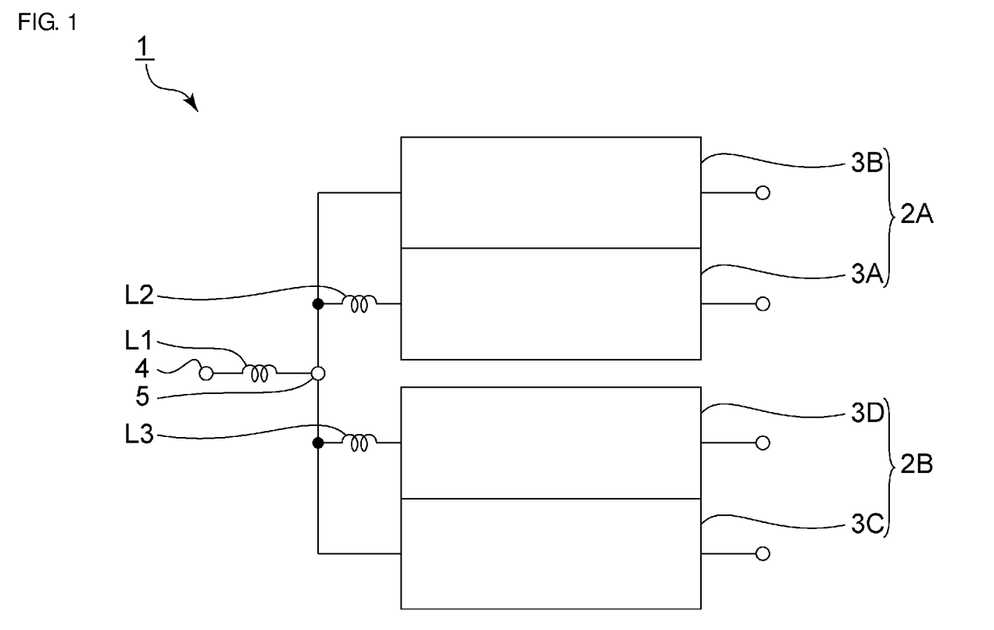
FIG. 1 is a schematic circuit diagram of an elastic wave apparatus according to a first preferred embodiment of the present invention.

FIG. 1 is a schematic circuit diagram of an elastic wave apparatus 1 according to a first preferred embodiment of the present invention.

The elastic wave apparatus 1 includes first and second duplexers 2A and 2B. The first duplexer 2A includes first and second band pass filters 3A and 3B. The pass bands of the first and second band pass filters 3A and 3B are different from each other. The second duplexer 2B includes third and fourth band pass filters 3C and 3D. The pass bands of the third and fourth band pass filters 3C and 3D are different from each other.

The elastic wave apparatus 1 includes a common connecting terminal 5 connected to all of the first through fourth band pass filters 3A through 3D. The elastic wave apparatus 1 also includes an antenna terminal 4 connected to an antenna and to the common connecting terminal 5.

The configuration of the elastic wave apparatus 1 is not restricted to that described above. The elastic wave apparatus 1 may be configured in any manner as long as it includes a plurality of filter devices electrically connected to the antenna terminal 4. For example, a plurality of band pass filters which do not form a duplexer may be connected to the antenna terminal 4. The provision of the common connecting terminal 5 in the elastic wave apparatus 1 may be omitted. In this case, the elastic wave apparatus 1 includes a common node to which a plurality of filter devices are connected.

The pass bands of the first through fourth band pass filters 3A through 3D in the first preferred embodiment are determined as follows. The pass band of the first band pass filter 3A is preferably about 1930 MHz to about 1995 MHz, for example, which is the receive band of Band25. The pass band of the second band pass filter 3B is preferably about 1850 MHz to about 1915 MHz, for example, which is the transmit band of Band25. The pass band of the third band pass filter 3C is preferably about 2110 MHz to about 2200 MHz, for example, which is the receive band of Band66. The pass band of the fourth band pass filter 3D is preferably about 1710 MHz to about 1780 MHz, for example, which is the transmit band of Band66. The pass bands of the first through fourth band pass filters 3A through 3D are not limited to the above-described ranges. The circuit configurations of the first through fourth band pass filters 3A through 3D are not restricted to a particular configuration.

The elastic wave apparatus 1 includes a first inductor L1 connected to the antenna terminal 4. In the first preferred embodiment, the first inductor L1 is connected between the antenna terminal 4 and the common connecting terminal 5. The elastic wave apparatus 1 also includes a second inductor L2 connected between the first band pass filter 3A and the common connecting terminal 5. The first inductor L1 provides impedance matching for the antenna terminal 4 side. The second inductor L2 provides impedance matching between the first through fourth band pass filters 3A through 3D.

In the first preferred embodiment, an inductor L3 is connected between the fourth band pass filter 3D and the common connecting terminal 5. The elastic wave apparatus 1 may include an inductor, such as the inductor L3, other than the first and second inductors L1 and L2. However, inductors other than the first and second inductors L1 and L2 may be omitted.

Figure 2:
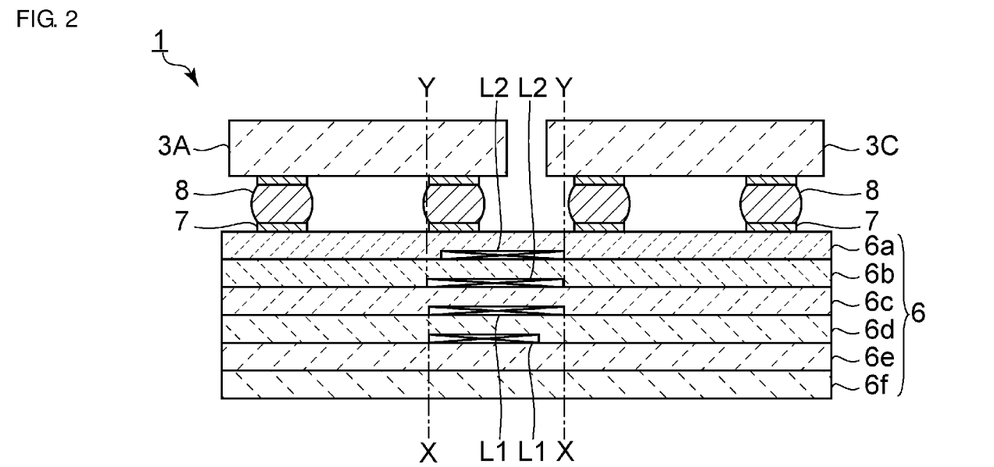
FIG. 2 is a schematic sectional view of the elastic wave apparatus according to the first preferred embodiment of the present invention.

FIG. 2 is a schematic sectional view of the elastic wave apparatus 1 according to the first preferred embodiment. In FIG. 2, wiring portions other than those for the first and second inductors L1 and L2 are not shown. The first and second inductors L1 and L2 are schematically indicated by rectangular portions each with two diagonal lines.

The elastic wave apparatus 1 includes a multilayer substrate 6 on which the first through fourth band pass filters 3A through 3D are mounted. In FIG. 2, only the first and third band pass filters 3A and 3C are shown. The configuration in which the first through fourth band pass filters 3A through 3D are mounted on the multilayer substrate 6 will be explained more specifically with reference to the first band pass filter 3A as an example. A plurality of connecting terminals 7 are disposed on the multilayer substrate 6. The first band pass filter 3A is bonded to the plurality of connecting terminals 7 on the multilayer substrate 6 by using bumps 8. Instead of the bumps 8, a conductive adhesive may be used to bond the first band pass filter 3A to the plurality of connecting terminals 7. The second through fourth band pass filters 3B through 3D are also bonded to the plurality of connecting terminals 7 in the same or similar manner.

The multilayer substrate 6 includes first through sixth wiring layers 6a through 6f, which correspond to a plurality of wiring layers. The first through fourth band pass filters 3A through 3D are mounted on the first wiring layer 6a.

Figure 3:
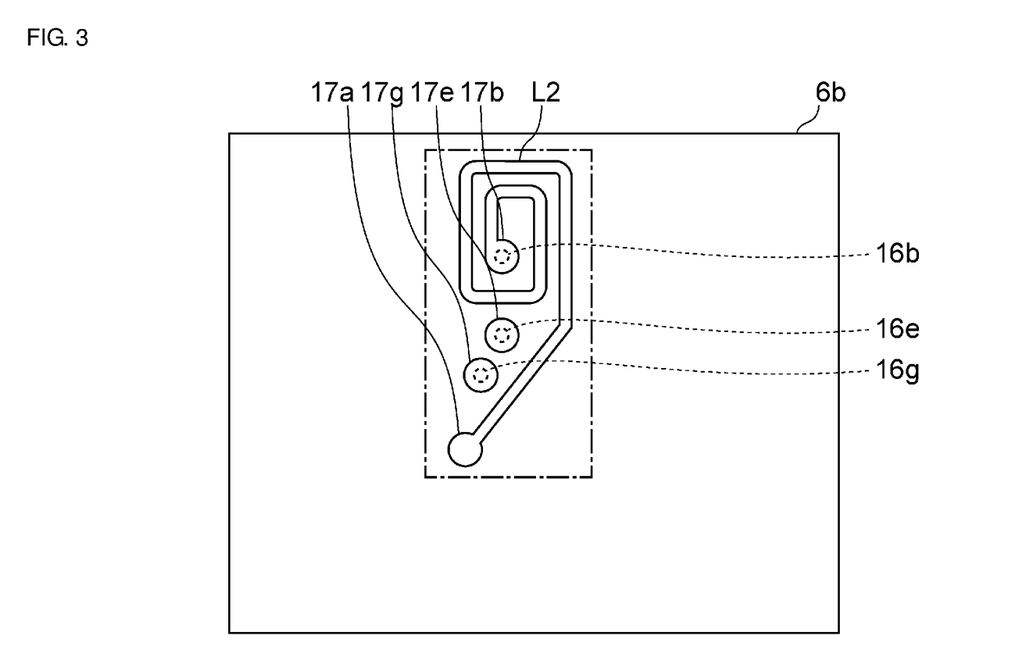
FIG. 3 is a schematic plan view of the electrode configuration on a second wiring layer of a multilayer substrate in the first preferred embodiment of the present invention.
Figure 4:
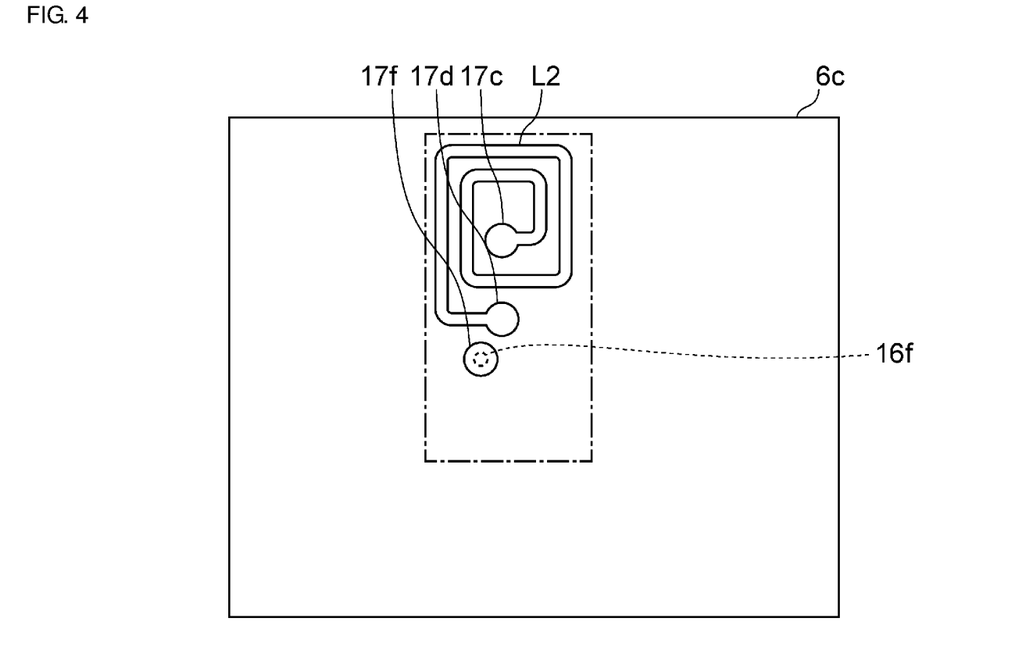
FIG. 4 is a schematic plan view of the electrode configuration on a third wiring layer of the multilayer substrate in the first preferred embodiment of the present invention.
Figure 5:
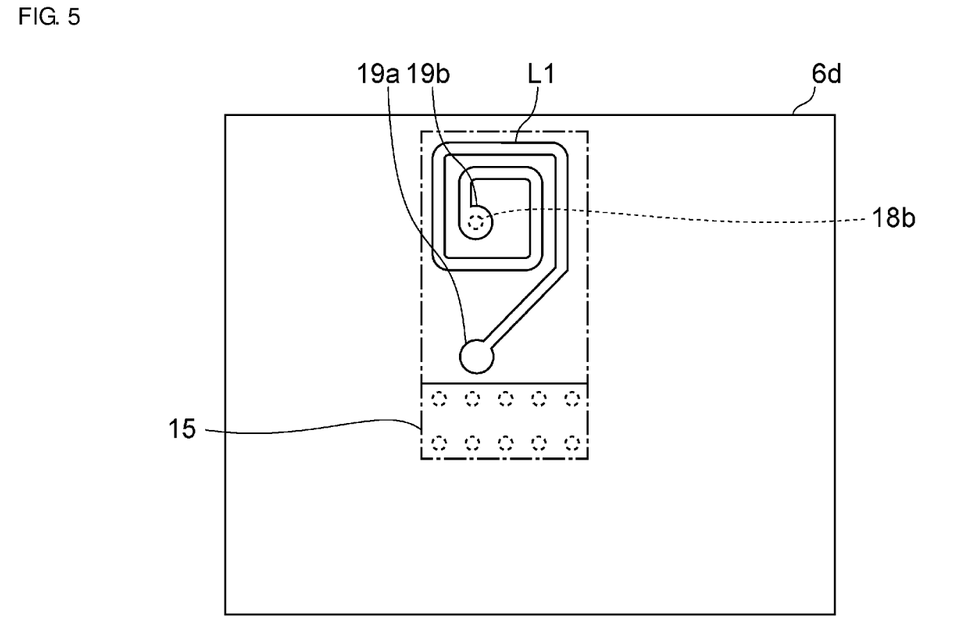
FIG. 5 is a schematic plan view of the electrode configuration on a fourth wiring layer of the multilayer substrate in the first preferred embodiment of the present invention.
Figure 6:
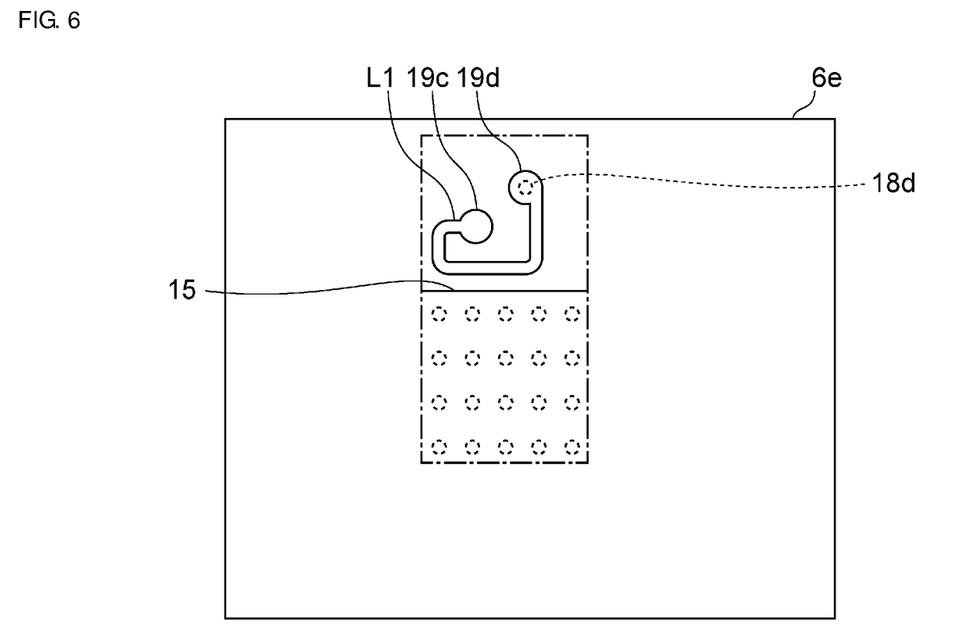
FIG. 6 is a schematic plan view of the electrode configuration on a fifth wiring layer of the multilayer substrate in the first preferred embodiment of the present invention.

FIG. 3 is a schematic plan view of the electrode configuration on the second wiring layer 6b in the first preferred embodiment. FIG. 4 is a schematic plan view of the electrode configuration on the third wiring layer 6c in the first preferred embodiment. FIG. 5 is a schematic plan view of the electrode configuration on the fourth wiring layer 6d in the first preferred embodiment. FIG. 6 is a schematic plan view of the electrode configuration on the fifth wiring layer 6e in the first preferred embodiment. In the electrode configurations shown in FIGS. 3 through 6, portions other than those surrounded by the long dashed dotted lines are not shown.

As shown in FIGS. 3 and 4, the second inductor L2 is defined by wiring portions provided on the second and third wiring layers 6b and 6c. The second inductor L2 preferably has a spiral shape as viewed from above. A portion of the second inductor L2 disposed on the second wiring layer 6b and that on the third wiring layer 6c are connected to each other by a via-electrode 16b passing through the second wiring layer 6b.

The portions of the second inductor L2 disposed on the second and third wiring layers 6b and 6c will be explained more specifically. The portion of the second inductor L2 disposed on the second wiring layer 6b includes terminals 17a and 17b located at both ends of the spiral shape. The portion of the second inductor L2 disposed on the third wiring layer 6c includes terminals 17c and 17d located at both ends of the spiral shape. The via-electrode 16b connects the terminals 17b and 17c. The terminal 17d is connected to a terminal 17e provided on the second wiring layer 6b. The terminals 17d and 17e are connected to each other by a via-electrode 16e passing through the second wiring layer 6b. One of the terminals 17a and 17e is electrically connected to the common connecting terminal 5 by a via-electrode passing through the first wiring layer 6a and wiring on the first wiring layer 6a. The other one of the terminals 17a and 17e is electrically connected to the first band pass filter 3A by the via-electrode passing through the first wiring layer 6a and the wiring on the first wiring layer 6a.

As shown in FIGS. 5 and 6, the first inductor L1 is defined by wiring portions provided on the fourth and fifth wiring layers 6d and 6e. The first inductor L1 preferably has a spiral shape as viewed from above. A portion of the first inductor L1 disposed on the fourth wiring layer 6d and that on the fifth wiring layer 6e are connected to each other by a via-electrode 18b passing through the fourth wiring layer 6d.

The portions of the first inductor L1 disposed on the fourth and fifth wiring layers 6d and 6e will be explained more specifically. The portion of the first inductor L1 disposed on the fourth wiring layer 6d includes terminals 19a and 19b located at both ends of the spiral shape. The portion of the first inductor L1 disposed on the fifth wiring layer 6e includes terminals 19c and 19d located at both ends of the spiral shape. The via-electrode 18b connects the terminals 19b and 19c. The terminal 19d is electrically connected to the antenna terminal 4 disposed on the sixth wiring layer 6f. The terminal 19d and the antenna terminal 4 are electrically connected to each other by a via-electrode 18d passing through the fifth wiring layer 6e.

The terminal 19a shown in FIG. 5 is connected to the terminal 17f provided on the third wiring layer 6c shown in FIG. 4. The terminals 19a and 17f are connected to each other by a via-electrode 16f passing through the third wiring layer 6c. The terminal 17f is connected to a terminal 17g provided on the second wiring layer 6b shown in FIG. 3. The terminals 17f and 17g are connected to each other by a via-electrode 16g passing through the second wiring layer 6b. The terminal 17g is electrically connected to the common connecting terminal 5 by the via-electrode passing through the first wiring layer 6a and the wiring on the first wiring layer 6a.

The first inductor L1 may be provided on at least one of the plurality of wiring layers 6a through 6f. The second inductor L2 may be provided on at least one of the plurality of wiring layers 6a through 6f. The second inductor L2 is disposed on a wiring layer different from that on which the first inductor L1 is disposed. The shape of the first and second inductors L1 and L2 viewed from above is not restricted to a spiral shape, and may be a meandering shape, for example.

In the first preferred embodiment, the first and second inductors L1 and L2 overlap each other at least partially as viewed from above, as shown in FIGS. 3 through 6. Because of this configuration, the size and the insertion loss of the elastic wave apparatus 1 are reduced. This will be explained below by comparison with a comparative example. In the following description, the length of wiring defining the first inductor L1 is regarded as the length of the first inductor L1 and the length of wiring defining the second inductor L2 is regarded as the length of the second inductor L2.

Figure 7:
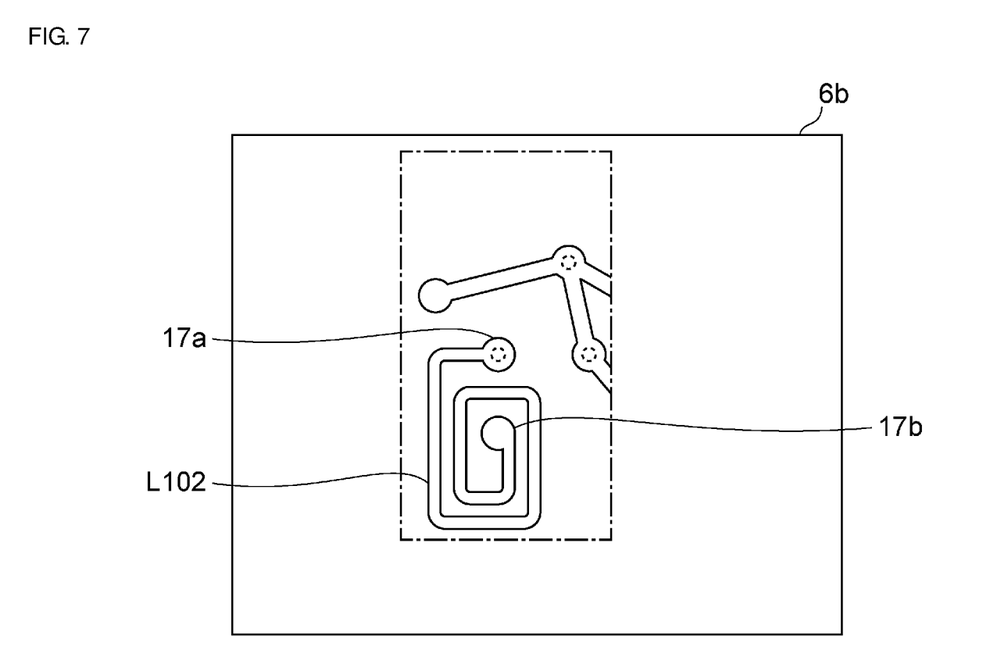
FIG. 7 is a schematic plan view of the electrode configuration on a second wiring layer of a multilayer substrate in a comparative example.
Figure 8:
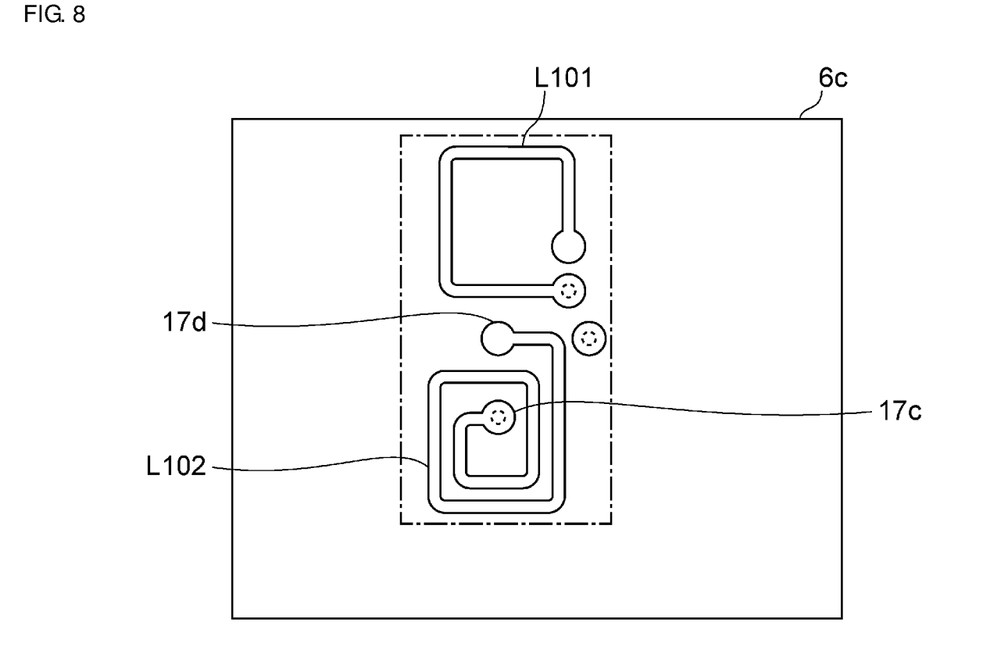
FIG. 8 is a schematic plan view of the electrode configuration on a third wiring layer of the multilayer substrate in the comparative example.
Figure 9:
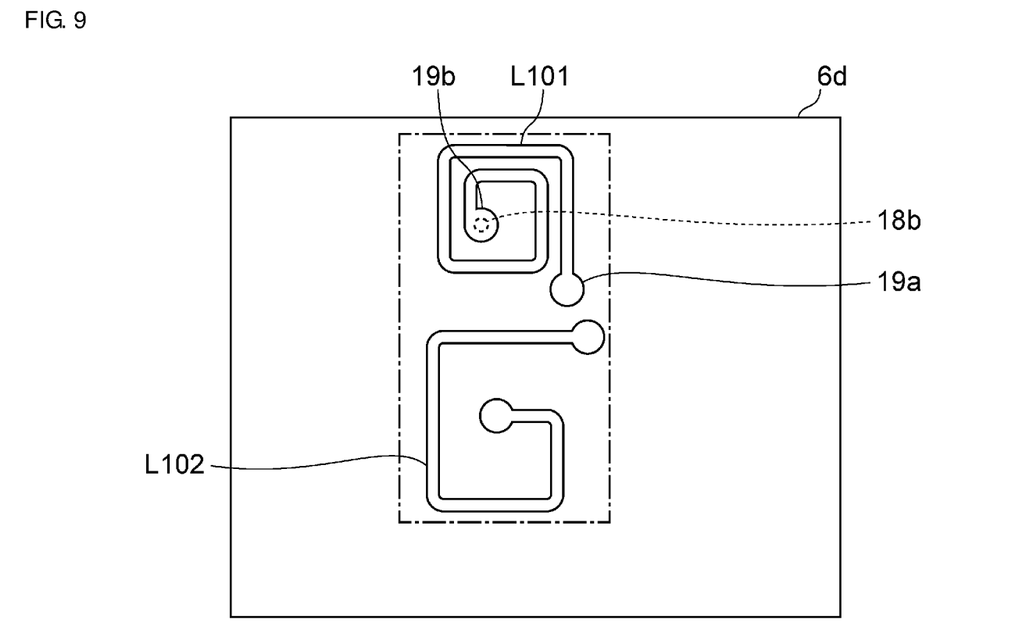
FIG. 9 is a schematic plan view of the electrode configuration on a fourth wiring layer of the multilayer substrate in the comparative example.
Figure 10:
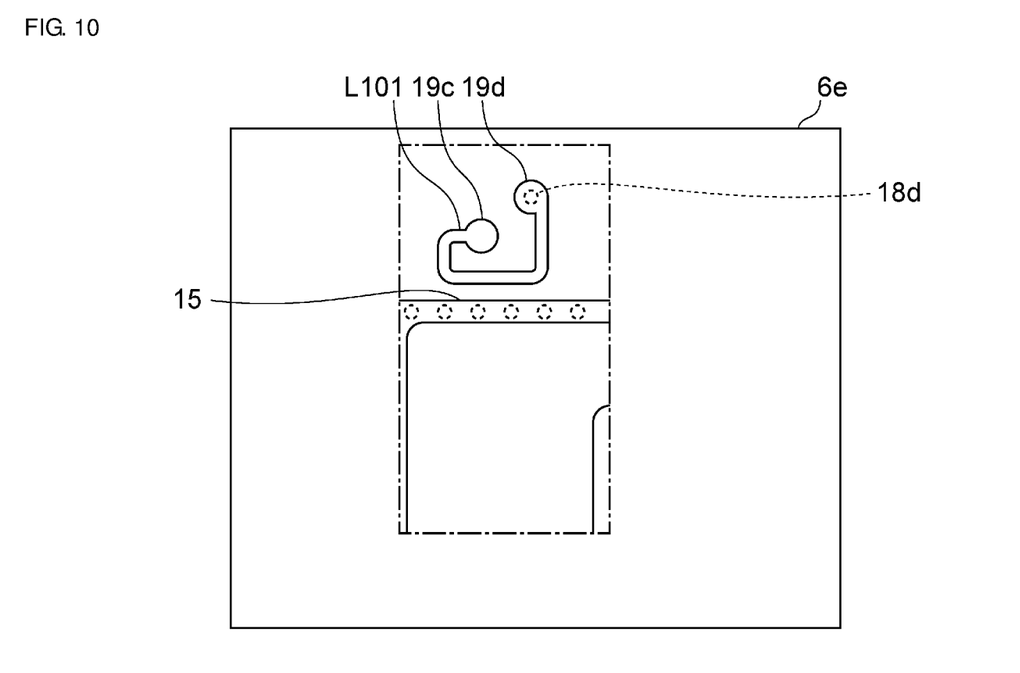
FIG. 10 is a schematic plan view of the electrode configuration on a fifth wiring layer of the multilayer substrate in the comparative example.

FIG. 7 is a schematic plan view of the electrode configuration on a second wiring layer 6b in the comparative example. FIG. 8 is a schematic plan view of the electrode configuration on a third wiring layer 6c in the comparative example. FIG. 9 is a schematic plan view of the electrode configuration on a fourth wiring layer 6d in the comparative example. FIG. 10 is a schematic plan view of the electrode configuration on a fifth wiring layer 6e in the comparative example. In the electrode configurations shown in FIGS. 7 through 10, portions other than those surrounded by the long dashed dotted lines are not shown.

As shown in FIGS. 7 through 10, the arrangement of first and second inductors L101 and L102 in the comparative example is different from that in the first preferred embodiment. As shown in FIGS. 7 through 9, the second inductor L102 is provided on the second, third, and fourth wiring layers 6b, 6c, and 6d. In the comparative example, terminals 17a and 17d are connected to each other by a via-electrode.

The length of the portion of the second inductor L102 provided on the second wiring layer 6b is the same or substantially the same as that of the second inductor L2 on the second wiring layer 6b in the first preferred embodiment. The length of the portion of the second inductor L102 provided on the third wiring layer 6c is the same or substantially the same as that of the second inductor L2 on the third wiring layer 6c in the first preferred embodiment. Accordingly, the second inductor L102 is longer than the second inductor L2 in the first preferred embodiment by the length of the portion of the second inductor L102 provided on the fourth wiring layer 6d.

As shown in FIGS. 8 through 10, the first inductor L101 is provided on the third, fourth, and fifth wiring layers 6c, 6d, and 6e. The length of the portion of the first inductor L101 provided on the fourth wiring layer 6d is the same or substantially the same as that of the first inductor L1 on the fourth wiring layer 6d in the first preferred embodiment. The length of the portion of the first inductor L101 provided on the fifth wiring layer 6e is the same or substantially the same as that of the first inductor L1 on the fifth wiring layer 6e in the first preferred embodiment. Accordingly, the first inductor L101 is longer than the first inductor L1 in the first preferred embodiment by the length of the portion of the first inductor L101 provided on the third wiring layer 6c.

To provide sufficient impedance matching using the first inductor L101, the first inductor L101 is required to have a predetermined length. For this reason, the first inductor L101 is provided on the third wiring layer 6c as well as the fourth and fifth wiring layers 6d and 6e. For the same reason, the second inductor L102 is provided on the fourth wiring layer 6d as well as the second and third wiring layers 6b and 6c.

In contrast, in the first preferred embodiment, the first and second inductors L1 and L2 overlap each other at least partially as viewed from above, as shown in FIGS. 3 through 6. With this configuration, the first and second inductors L1 and L2 are strongly electromagnetically coupled with each other, thus increasing the inductance values of the first and second inductors L1 and L2. Even with a shorter length of the first inductor L1, sufficient impedance matching is able to be provided. In the first preferred embodiment, sufficient impedance matching is provided even though the first inductor L1 is not disposed on the third wiring layer 6c, as shown in FIG. 4.

Similarly, sufficient impedance matching is able to be provided even though the second inductor L2 is not provided on the fourth wiring layer 6d, as shown in FIG. 5. As a result, in the first preferred embodiment, the area required for the first and second inductors L1 and L2 is decreased, as shown in FIGS. 3 through 6, thus reducing the size of the elastic wave apparatus 1.

Figure 11:
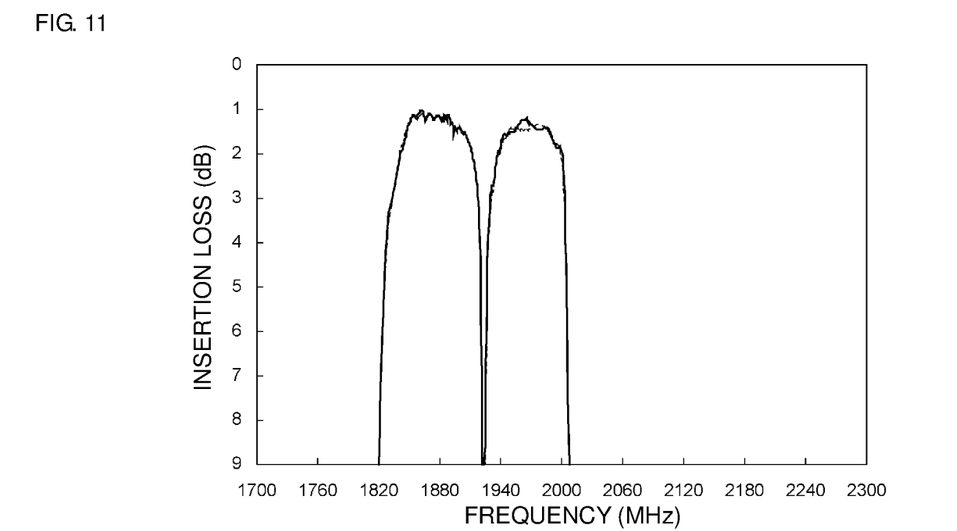
FIG. 11 is a graph illustrating the attenuation-frequency characteristics of a first duplexer according to the first preferred embodiment of the present invention and those of the comparative example.
Figure 12:
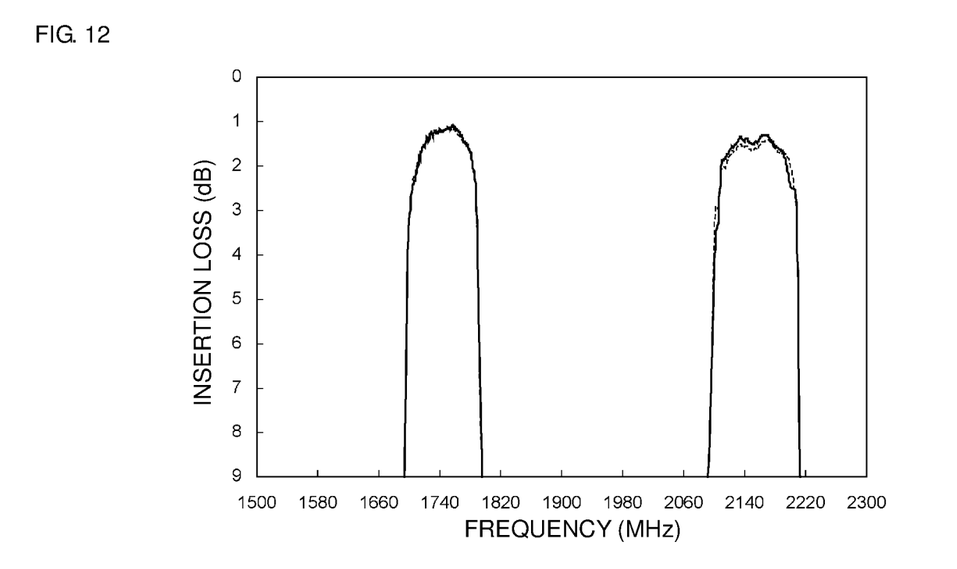
FIG. 12 is a graph illustrating the attenuation-frequency characteristics of a second duplexer according to the first preferred embodiment of the present invention and those of the comparative example.

FIG. 11 is a graph illustrating the attenuation-frequency characteristics of the first duplexer of the first preferred embodiment and those of the comparative example. FIG. 12 is a graph illustrating the attenuation-frequency characteristics of the second duplexer of the first preferred embodiment and those of the comparative example. In FIGS. 11 and 12, the solid lines indicate the attenuation-frequency characteristics of the first preferred embodiment, while the broken lines indicate the attenuation-frequency characteristics of the comparative example.

FIGS. 11 and 12 show that the insertion loss of the first and second duplexers of the first preferred embodiment is smaller than that of the comparative example. In the first preferred embodiment, the insertion loss in the pass bands of the first and third band pass filters 3A and 3C, which are receive filters, are particularly small.

As discussed above, in the elastic wave apparatus 1 shown in FIG. 1, the lengths of the wiring portions defining the first and second inductors L1 and L2 are decreased. The equivalent series resistance is thus decreased, and the parasitic capacitance is accordingly decreased. As a result, the quality (Q) factor is increased, and the insertion loss is reduced.

As shown in FIGS. 9 and 10, on the fifth wiring layer 6e in the comparative example, an electrode 15 to be connected to a ground potential is not disposed in a portion opposing the second inductor L102. Without the electrode 15, the connection strength of the electrode 15 to a ground potential becomes weak. On the other hand, if the electrode 15 is provided in a portion on the fifth wiring layer 6e which opposes the second inductor L102, parasitic capacitance is produced between the electrode 15 and the second inductor L102. This may deteriorate filter characteristics, such as the insertion loss.

In contrast, in the first preferred embodiment, the second inductor L2 is not disposed on the fourth wiring layer 6d, as shown in FIG. 5. Accordingly, even though a large area of the electrode 15 to be connected to a ground potential is provided on the fifth wiring layer 6e, as shown in FIG. 6, filter characteristics are unlikely to be deteriorated. As stated above, the second inductor L2 is not disposed on the fourth wiring layer 6d, and thus, a large area of the electrode 15 is also able to be provided on the fourth wiring layer 6d. As a result, the filter characteristics are unlikely to be deteriorated, and the connection of the electrode 15 with a ground potential is effectively improved.

Concerning the third and fourth wiring layers 6c and 6d adjacent to each other, a portion of the second inductor L2 is disposed on the third wiring layer 6c, and a portion of the first inductor L1 is disposed on the fourth wiring layer 6d. This further strengthens electromagnetic coupling between the first and second inductors L1 and L2 and, accordingly, further decreases the lengths of the wiring portions defining the first and second inductors L1 and L2. The first and second inductors L1 and L2 may oppose each other with another wiring layer interposed therebetween which is provided between the third and fourth wiring layers 6c and 6d.

In the first preferred embodiment, the length of the portion of the second inductor L2 disposed on the third wiring layer 6c positioned closer to the first inductor L1 than that on the second wiring layer 6b is longer than that disposed on the second wiring layer 6b. The length of the portion of the first inductor L1 disposed on the fourth wiring layer 6d positioned closer to the second inductor L2 than that on the fifth wiring layer 6e is longer than that disposed on the fifth wiring layer 6e. This makes it possible to increase the design flexibility in the second and fifth wiring layers 6b and 6e positioned on the outer side of the multilayer substrate 6.

Alternatively, the lengths of the portions of the first inductor L1 disposed on the wiring layers may be the same or substantially the same. Similarly, the lengths of the portions of the second inductor L2 disposed on the wiring layers may be the same or substantially the same.

The two long dashed dotted lines X in FIG. 2 indicate the outer peripheral edge of the first inductor L1 as viewed from above. The two long dashed two-dotted lines Y in FIG. 2 indicate the outer peripheral edge of the second inductor L2 as viewed from above. As in the first preferred embodiment, it is preferable that at least a portion of the outer peripheral edge of the first inductor L1 is located in a region surrounded by the outer peripheral edge of the second inductor L2. It is more preferable that the entirety or substantially the entirety of the outer peripheral edge of the first inductor L1 be located in the region surrounded by the outer peripheral edge of the second inductor L2. This configuration even further strengthens electromagnetic coupling between the first and second inductors L1 and L2.

In this specification, "being located in the region surrounded by the outer peripheral edge" also means that the outer peripheral edge of the first inductor L1 and that of the second inductor L2 match or are aligned with each other, or the outer peripheral edge of one inductor is inside that of the other inductor as viewed from above.

Alternatively, the outer peripheral edge of the second inductor L2 viewed from above may be located in a region surrounded by the outer peripheral edge of the first inductor L1 as viewed from above. In this case, it is preferable that the entirety or substantially the entirety of the outer peripheral edge of the second inductor L2 viewed from above is located in the region surrounded by the outer peripheral edge of the first inductor L1 as viewed from above. This even further strengthens electromagnetic coupling between the first and second inductors L1 and L2.

Figure 13:
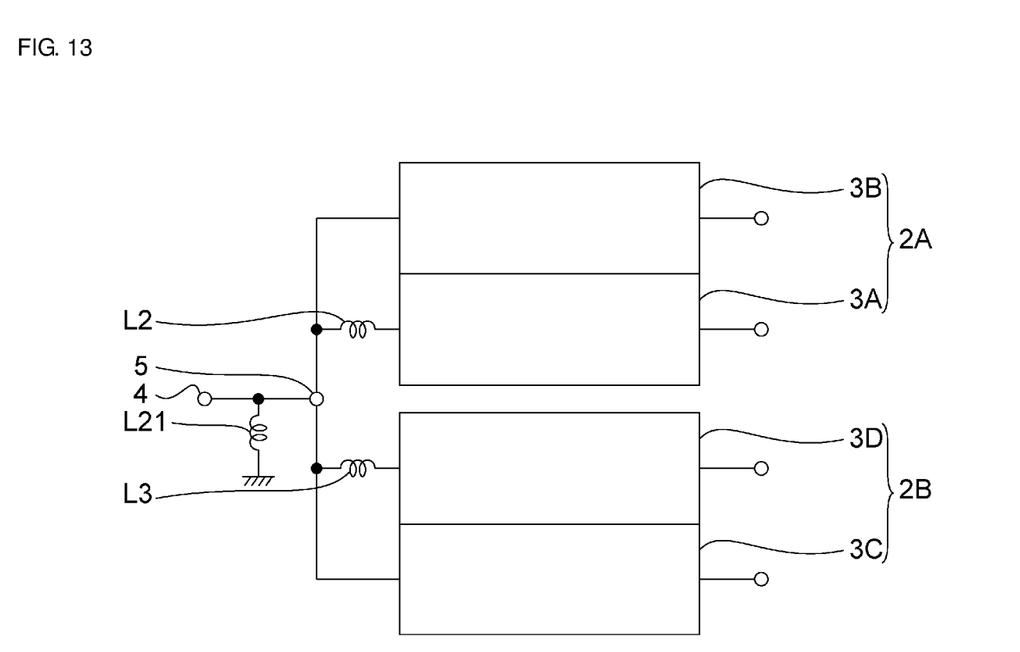
FIG. 13 is a schematic circuit diagram of an elastic wave apparatus according to a second preferred embodiment of the present invention.

FIG. 13 is a schematic circuit diagram of an elastic wave apparatus according to a second preferred embodiment of the present application.

The second preferred embodiment is different from the first preferred embodiment in that a first inductor L21 is connected between the antenna terminal 4 and a ground potential. Except for this point, the configuration of the elastic wave apparatus of the second preferred embodiment is similar to that of the elastic wave apparatus 1 of the first preferred embodiment.

In the second preferred embodiment, as well as in the first preferred embodiment, the first and second inductors L21 and L2 overlap each other at least partially as viewed from above. It is thus possible to reduce the size and the insertion loss of the elastic wave apparatus, as in the first preferred embodiment.

Figure 14:
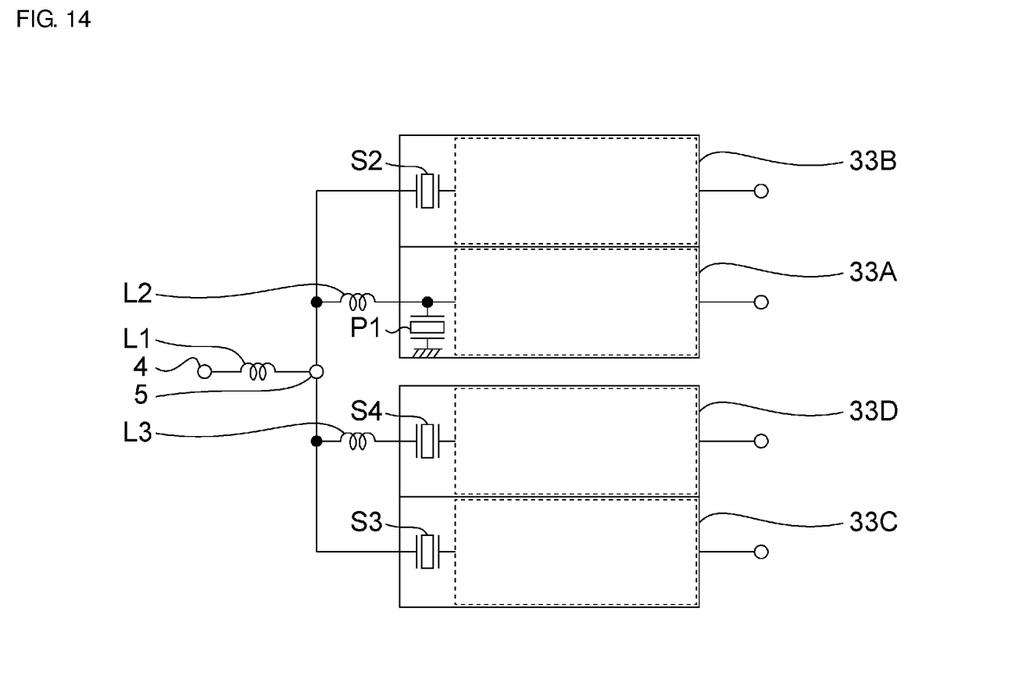
FIG. 14 is a schematic circuit diagram of an elastic wave apparatus according to a third preferred embodiment of the present invention.

FIG. 14 is a schematic circuit diagram of an elastic wave apparatus according to a third preferred embodiment of the present invention. In FIG. 14, the circuit configurations of band pass filters are schematically indicated by blocks using the broken lines, except for filter elements positioned most closely to the common connecting terminal 5 among plurality of filter elements. The entirety or substantially the entirety of each of the band pass filters is indicated by a rectangular portion using the solid lines.

In the first preferred embodiment, the circuit configurations of the band pass filters are not restricted to a particular configuration. In the third preferred embodiment, however, the band pass filters preferably have the following circuit configurations. Except for the circuit configurations of the band pass filters, the configuration of the elastic wave apparatus of the third preferred embodiment is similar to that of the elastic wave apparatus 1 of the first preferred embodiment.

First through fourth band pass filters 33A through 33D each include plurality of filter elements. Examples of the plurality of filter elements are series arm resonators, parallel arm resonators, longitudinally coupled resonator-type elastic wave filters, inductors, and capacitors.

One of the plurality of filter elements of the first band pass filter 33A which is connected to the common connecting terminal 5 via the second inductor L2 is preferably a parallel arm resonator P1. Among the plurality of filter elements of the first band pass filter 33A, the parallel arm resonator P1 is positioned most closely to the common connecting terminal 5. The parallel arm resonator P1 is connected between the second inductor L2 and a ground potential.

One of the plurality of filter elements of each of the second through fourth band pass filters 33B through 33D other than the first band pass filter 33A is preferably a series arm resonator. The series arm resonators of the second through fourth band pass filters 33B through 33D will be discussed more specifically. The second band pass filter 33B includes a series arm resonator S2. Among the plurality of filter elements of the second band pass filter 33B, the series arm resonator S2 is positioned closest to the common connecting terminal 5. The third band pass filter 33C includes a series arm resonator S3. Among the plurality of filter elements of the third band pass filter 33C, the series arm resonator S3 is positioned closest to the common connecting terminal 5. The fourth band pass filter 33D includes a series arm resonator S4. Among the plurality of filter elements of the fourth band pass filter 33D, the series arm resonator S4 is positioned closest to the common connecting terminal 5.

The circuit configurations of the first through fourth band pass filters 33A through 33D are not restricted to a particular configuration, except for the filter elements positioned closest to the common connecting terminal 5. For example, the band pass filters may each include a plurality of parallel arm resonators, and a plurality of series arm resonators. In this case, in the first band pass filter 33A connected to the common connecting terminal 5 via the second inductor L2, one of the plurality of parallel arm resonators is connected between the second inductor L2 and a ground potential. This parallel arm resonator may be connected between a ground potential and a node between the second inductor L2 and a series arm resonator. In each of the second through fourth band pass filters 33B through 33D, one of the plurality of series arm resonators is a filter element positioned closest to the common connecting terminal 5.

An inductor L3 is connected between the fourth band pass filter 33D and the common connecting terminal 5, as shown in FIG. 14. However, the inductor L3 may be omitted.

In the third preferred embodiment, as well as in the first preferred embodiment, the first and second inductors L1 and L2 overlap each other at least partially as viewed from above. It is thus possible to reduce the size and the insertion loss of the elastic wave apparatus.

The second through fourth band pass filters 33B through 33D become capacitive because the series arm resonators are positioned closest to the common connecting terminal 5. In contrast, the first band pass filter 33A becomes inductive because the parallel arm resonator is positioned closest to the common connecting terminal 5. In the third preferred embodiment, therefore, the positive and negative signs of the complex components of complex impedance of the second through fourth band pass filters 33B through 33D are opposite to those of the first band pass filter 33A. This facilitates impedance matching among the first through fourth band pass filters 33A through 33D.

As discussed above, the second inductor L2 is an inductor that provides impedance matching among the first through fourth band pass filters 33A through 33D. In the third preferred embodiment, the inductance value of the second inductor L2 is able to be effectively decreased, thus making it possible to effectively reduce the insertion loss.

Effectively decreasing the inductance value of the second inductor L2 further decreases the length of the second inductor L2. The parasitic capacitance is thus able to be reduced, and the insertion loss is further reduced. Additionally, the size of the elastic wave apparatus is also further reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave apparatus comprising:
   a multilayer substrate including a plurality of wiring layers;

a plurality of filter devices disposed on the multilayer substrate and connected to a common node;
an antenna terminal to be connected to an antenna and to the common node;
a first inductor connected to the antenna terminal; and
a second inductor connected between one of the plurality of filter devices and the common node; wherein
the first inductor is disposed on at least one of the plurality of wiring layers;
the second inductor is disposed on a wiring layer which is different from the at least one of the plurality of wiring layers on which the first inductor is disposed; and
the first and second inductors overlap each other at least partially as viewed from above.

2. The elastic wave apparatus according to claim 1, wherein the first inductor is connected between the antenna terminal and the common node.

3. The elastic wave apparatus according to claim 1, wherein the first inductor is connected between the antenna terminal and a ground potential.

4. The elastic wave apparatus according to claim 1, wherein each of the first and second inductors is disposed on multiple wiring layers of the plurality of wiring layers.

5. The elastic wave apparatus according to claim 4, wherein
a portion of the first inductor disposed on a wiring layer of the at least one of the plurality of wiring layers positioned closest to the second inductor has a longest length; and
a portion of the second inductor disposed on a wiring layer positioned closest to the first inductor has a longest length.

6. The elastic wave apparatus according to claim 1, wherein, in adjacent wiring layers among the plurality of wiring layers, at least a portion of the first inductor is disposed on one of the adjacent wiring layers, and at least a portion of the second inductor is disposed on another one of the adjacent wiring layers.

7. The elastic wave apparatus according to claim 1, wherein at least a portion of an outer peripheral edge of the first inductor viewed from above is positioned in a region surrounded by an outer peripheral edge of the second inductor as viewed from above.

8. The elastic wave apparatus according to claim 1, wherein at least a portion of an outer peripheral edge of the second inductor viewed from above is positioned in a region surrounded by an outer peripheral edge of the first inductor as viewed from above.

9. The elastic wave apparatus according to claim 1, wherein each of the first and second inductors has a spiral shape as viewed from above.

10. The elastic wave apparatus according to claim 1, wherein
among the plurality of filter devices, in a filter device connected to the common node via the second inductor, a parallel arm resonator is connected between the second inductor and a ground potential; and
among the plurality of filter devices, in each of the filter devices other than the filter device connected to the common node via the second inductor, a series arm resonator is located closest to the common node.

11. The elastic wave apparatus according to claim 1, wherein the plurality of filter devices include first and second duplexers.

12. The elastic wave apparatus according to claim 11, wherein
the first duplexer includes first and second band pass filters having different pass bands; and
the second duplexer includes third and fourth band pass filters having different pass bands.

13. The elastic wave apparatus according to claim 12, wherein
the pass band of the first band pass filter is about 1930 MHz to about 1995 MHz;
the pass band of the second band pass filter is about 1850 MHz to about 1915 MHz;
the pass band of the third band pass filter is about 2110 MHz to about 2200 MHz; and
the pass band of the fourth band pass filter is about 1710 MHz to about 1780 MHz.

14. The elastic wave apparatus according to claim 12, wherein the second inductor is connected between the first band pass filter and the common node.

15. The elastic wave apparatus according to claim 12, wherein the second inductor provides impedance matching between the first, second, third, and fourth band pass filters.

16. The elastic wave apparatus according to claim 12, further comprising a third inductor connected between the fourth band pass filter and the common node.

17. The elastic wave apparatus according to claim 1, further comprising:
a plurality of connecting terminals provided on the multilayer substrate; wherein
the plurality of filter devices are bonded to the plurality of connecting terminals.

18. The elastic wave apparatus according to claim 17, wherein the plurality of filter devices are bonded to the plurality of connecting terminals via bumps.

* * * * *